(12) United States Patent
Liu et al.

(10) Patent No.: US 9,985,023 B1
(45) Date of Patent: May 29, 2018

(54) STRUCTURE AND FORMATION METHOD OF SEMICONDUCTOR DEVICE STRUCTURE

(71) Applicant: Taiwan Semiconductor Manufacturing Co., Ltd., Hsinchu (TW)

(72) Inventors: Fa-Chih Liu, Hsinchu (TW); Shih-Ping Hong, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days. days.

(21) Appl. No.: 15/438,120

(22) Filed: Feb. 21, 2017

(51) Int. Cl.
| | |
|---|---|
| *H01L 21/8234* | (2006.01) |
| *H01L 27/088* | (2006.01) |
| *H01L 29/78* | (2006.01) |
| *H01L 29/06* | (2006.01) |
| *H01L 29/08* | (2006.01) |
| *H01L 29/417* | (2006.01) |
| *H01L 29/66* | (2006.01) |
| *H01L 21/311* | (2006.01) |
| *H01L 21/768* | (2006.01) |

(Continued)

(52) U.S. Cl.
CPC .... *H01L 27/0886* (2013.01); *H01L 21/31111* (2013.01); *H01L 21/76802* (2013.01); *H01L 21/76877* (2013.01); *H01L 21/76897* (2013.01); *H01L 21/823431* (2013.01); *H01L 21/823475* (2013.01); *H01L 21/823481* (2013.01); *H01L 29/0649* (2013.01); *H01L 29/0673* (2013.01); *H01L 29/0847* (2013.01); *H01L 29/41791* (2013.01); *H01L 29/42392* (2013.01); *H01L 29/66795* (2013.01); *H01L 29/7851* (2013.01); *H01L 21/823418* (2013.01); *H01L 21/823821* (2013.01); *H01L 29/41783* (2013.01); *H01L 29/66545* (2013.01)

(58) Field of Classification Search
CPC ..... H01L 21/823821; H01L 21/823418; H01L 27/0886; H01L 29/41791; H01L 29/41783; H01L 29/66545
USPC ........................................................ 257/330
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |

(Continued)

*Primary Examiner* — George Fourson, III

(74) *Attorney, Agent, or Firm* — Birch, Stewart, Kolasch & Birch, LLP

(57) ABSTRACT

Structures and formation methods of a semiconductor device structure are provided. The semiconductor device structure includes a fin structure over a semiconductor substrate. The semiconductor device structure also includes an isolation feature over the semiconductor substrate. The fin structure is surrounded by the isolation feature. The semiconductor device structure further includes a gate stack covering the fin structure. In addition, the semiconductor device structure includes a source or drain (S/D) structure covering the fin structure. The semiconductor device structure also includes a conductive contact connected to the S/D structure. The conductive contact includes a first portion and a second portion. The second portion extends from the first portion to the S/D structure. The first portion has a first width adjoining the second portion. The second portion has a second width greater than the first width.

20 Claims, 11 Drawing Sheets

(51) Int. Cl.
    *H01L 29/423*     (2006.01)
    *H01L 21/8238*     (2006.01)

(56) References Cited

U.S. PATENT DOCUMENTS

| | | |
|---|---|---|
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,379,025 B1 * | 6/2016 | Basker ............ H01L 21/823821 |
| 9,601,586 B1 * | 3/2017 | Kittl ................ H01L 29/41791 |
| 9,685,439 B1 * | 6/2017 | Lee .................. H01L 27/0886 |
| 2014/0001574 A1 | 1/2014 | Chen et al. |
| 2014/0110755 A1 | 4/2014 | Colinge |
| 2014/0151812 A1 | 6/2014 | Liaw |
| 2016/0284697 A1 * | 9/2016 | Yoon ................ H01L 27/088 |
| 2016/0284806 A1 * | 9/2016 | Park ................ H01L 29/41791 |
| 2017/0018464 A1 * | 1/2017 | Kim ................ H01L 21/823871 |
| 2017/0125543 A1 * | 5/2017 | Greene ............ H01L 29/665 |

\* cited by examiner

STRUCTURE AND FORMATION METHOD OF SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
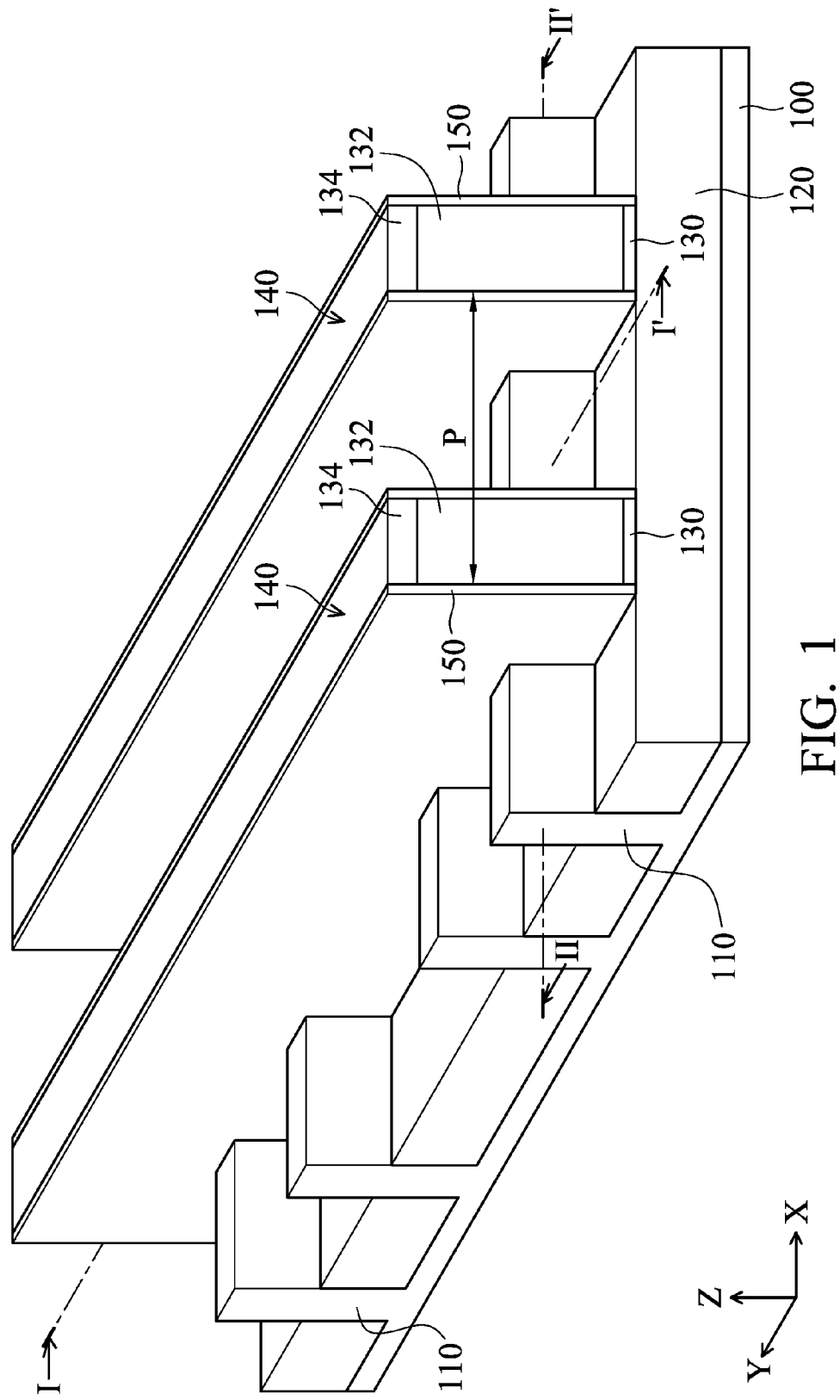
FIG. 1 is a perspective view of one stage of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure form a semiconductor device structure with a low contact resistance. Some embodiments of the disclosure are described. FIG. 1 is a perspective view of one stage of a process for forming a semiconductor device structure, in accordance with some embodiments. For a better understanding of the semiconductor device structure, an X-Y-Z coordinate reference is provided in FIG. 1. The X-axis is generally orientated along a substrate surface of a semiconductor device structure in the lateral direction. The Y-axis is generally oriented along the substrate surface perpendicular to the X-axis. The Z-axis is generally oriented along the substrate surface in the vertical direction perpendicular to the X-Y plane.

FIGS. 2A-2H are cross-sectional views of various stages of a process for forming a semiconductor device structure, in accordance with some embodiments. In some embodiments, FIGS. 2A-2H are cross-sectional views taken along line I-I' shown in FIG. 1. Line I-I' may be substantially parallel to the Y-axis. FIGS. 3A-3J are cross-sectional views of various stages of a process for forming a semiconductor device structure, in accordance with some embodiments. In some embodiments, FIGS. 3A-3J are cross-sectional views taken along line II-IF shown in FIG. 1. Line II-II' may be substantially parallel to the X-axis.

Additional operations can be provided before, during, and/or after the stages described in FIG. 1, FIGS. 2A-2H and FIGS. 3A-3J. Some of the stages that are described can be replaced or eliminated for different embodiments. Additional features can be added to the semiconductor device structure. Some of the features described below can be replaced or eliminated for different embodiments.

Figure 2A:
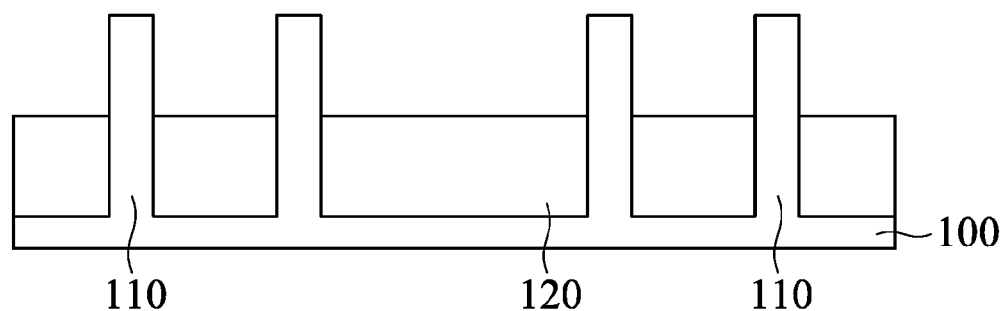
FIGS. 2A-2H are cross-sectional views of various stages of a process for forming a semiconductor device structure, in accordance with some embodiments.
Figure 3A:
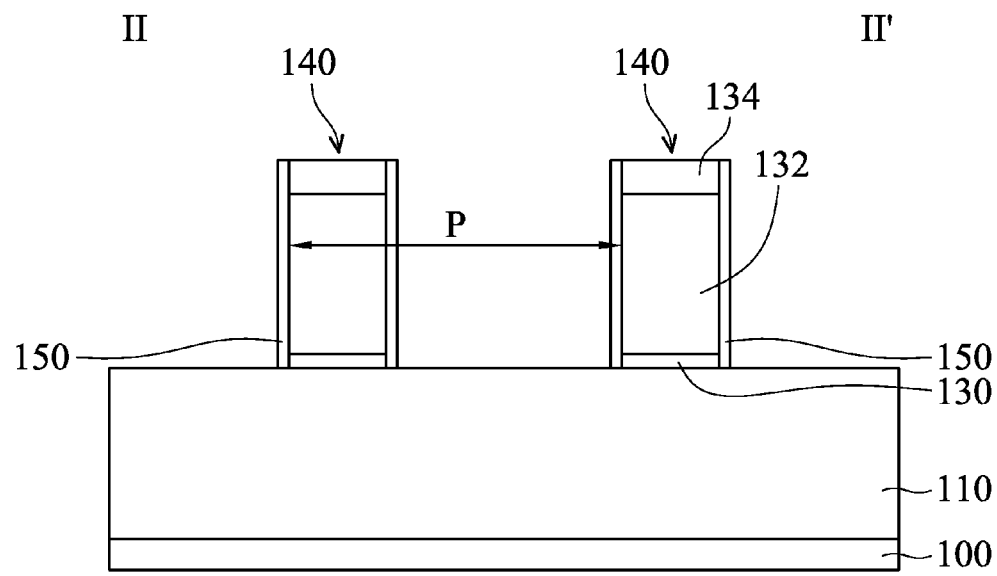
FIGS. 3A-3J are cross-sectional views of various stages of a process for forming a semiconductor device structure, in accordance with some embodiments.

As shown in FIGS. 1, 2A and 3A, a semiconductor substrate 100 is provided. The surface of the semiconductor substrate 100 is substantially parallel to the X-Y plane. In some embodiments, the semiconductor substrate 100 is a bulk semiconductor substrate, such as a semiconductor wafer. In some embodiments, the semiconductor substrate 100 includes silicon or another elementary semiconductor material such as germanium. For example, the semiconductor substrate 100 is a silicon wafer. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

As shown in FIGS. 1 and 2A, multiple fin structures 110 are over the semiconductor substrate 100, in accordance with some embodiments. The fin structures 110 extend along the X-axis and are arranged in a direction that is substantially parallel to the Y-axis, as shown in FIG. 1. FIGS. 1 and 2A show four fin structures 110 as an example, but embodiments of the disclosure are not limited thereto. The pitch between the fin structures 110 may or may not be the same. In some embodiments, one or more photolithography and etching processes are used to form multiple recesses or trenches (not shown) in the semiconductor substrate 100. As a result, multiple fin structures 110 are formed between the recesses.

As shown in FIGS. 1 and 2A, isolation features 120 are formed in the recesses of the semiconductor substrate 100 to surround lower portions of the fin structures 110, in accordance with some embodiments. The isolation features 120 are used to define and electrically isolate various device elements formed in and/or over the semiconductor substrate 100. In some embodiments, the isolation features 120 include shallow trench isolation (STI) features, local oxidation of silicon (LOCOS) features, other suitable isolation features, or a combination thereof.

In some embodiments, the isolation features 120 are made of a dielectric material. The dielectric material may include silicon oxide, silicon nitride, silicon oxynitride (SiON), spin-on glass, low-K dielectric material, another suitable material, or a combination thereof. In some embodiments, each of the isolation features 120 has a multi-layer structure. In some embodiments, a dielectric material layer is deposited over the semiconductor substrate 100. The dielectric material layer covers the fin structures 110 and fills the recesses between the fin structures 110. In some embodiments, the dielectric material layer is deposited using a chemical vapor deposition (CVD) process, a spin-on process, another applicable process, or a combination thereof. In some embodiments, a planarization process is performed to thin down the dielectric material layer until the top surfaces of the fin structures 110 are exposed. The planarization process may include a chemical mechanical polishing (CMP) process, a grinding process, an etching process, another applicable process, or a combination thereof. Afterwards, the dielectric material layer is etched back to form the isolation features 120. The fin structures 110 protrude from the isolation features 120, as shown in in FIGS. 1 and 2A in accordance with some embodiments.

In some embodiments, an STI liner (not shown) is formed before the formation of the isolation features 120. The STI liner may be used to reduce defects at the interface between the semiconductor substrate 100 and the isolation features 120. Similarly, the STI liner may also be used to reduce defects at the interface between the fin structures 110 and the isolation features 120.

As shown in FIGS. 1 and 3A, multiple gate stacks 140 are formed over the semiconductor substrate 100, in accordance with some embodiments. One of the gate stacks 140 partially covers multiple fin structures 110 and multiple isolation features 120. In some embodiments, the gate stacks 140 extend along the Y-axis and are arranged in a direction that is substantially parallel to the X-axis, as shown in FIG. 1. The gate stacks 140 may be sacrificial or dummy gate stacks, which will be removed in a subsequent process. In some embodiments, the pitch P between the gate stacks 140 is in a range from about 10 nm to about 90 nm. However, embodiments of the disclosure are not limited thereto.

In some embodiments, each of the gate stacks 140 includes a gate dielectric layer 130, a gate electrode 132 and a hard mask 134. The gate dielectric layer 130 extends over the fin structures 110 and the isolation features 120. In some embodiments, the gate dielectric layer 130 is a sacrificial or dummy gate dielectric layer and will be replaced with another gate dielectric layer. In some embodiments, the gate dielectric layer 130 is made of a high-K dielectric material. Examples of high-K dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, and combinations thereof.

The gate electrode 132 is formed over the gate dielectric layer 130. In some embodiments, the gate electrode 132 includes polysilicon, a metal material, another suitable conductive material, or a combination thereof. In some embodiments, the gate electrode 132 is a sacrificial or dummy gate electrode layer and will be replaced with another conductive material such as a metal material. The sacrificial gate electrode layer is made of a sacrificial material, for example, polysilicon.

In some embodiments, the hard mask 134 is formed over the gate electrode 132. The hard mask 134 may be used to assist in the patterning process for forming the gate dielectric layer 130 and the gate electrode 132. In some embodiments, the hard mask 134 includes silicon oxide, silicon nitride, silicon oxynitride, silicon carbide, another suitable material, or a combination thereof. In some embodiments, the hard mask 134 has a multi-layer structure.

For example, in some embodiments, a gate dielectric material layer, a gate electrode layer and a hard mask layer are sequentially deposited by using suitable deposition methods. The suitable deposition methods may a CVD process, an atomic layer deposition (ALD) process, a thermal oxidation process, a physical vapor deposition (PVD) process, another applicable process, or a combination thereof. Afterwards, a photolithography process and an etching process are performed to pattern the hard mask layer to form the hard mask 134. With the assistance of the hard mask 134, the gate dielectric material layer and the gate electrode layer are etched and patterned. As a result, the gate dielectric layer 130 and the gate electrode 132 are formed.

As shown in FIGS. 1 and 3A, spacer elements 150 are formed over sidewalls of the gate stacks 140, in accordance with some embodiments. The spacer elements 150 may contain a group-IV element, a group-V element, and/or a group-VI element. In some embodiments, the spacer elements 150 are made of silicon nitride, silicon oxynitride, silicon carbide, silicon oxycarbide, another suitable material, or a combination thereof. In some embodiments, a spacer layer is deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the gate stacks 140 form the spacer elements 150.

Although FIGS. 1 and 3A show that each of the spacer elements 150 is a single layer, embodiments of the disclosure are not limited thereto. In some other embodiments, each of the spacer elements 150 has a multi-layer structure. For example, each of the spacer elements 150 may include multiple nitride layers. Many variations and/or modifications can be made to embodiments of the disclosure. In some other embodiments, the spacer elements 150 are not formed.

Figure 2B:
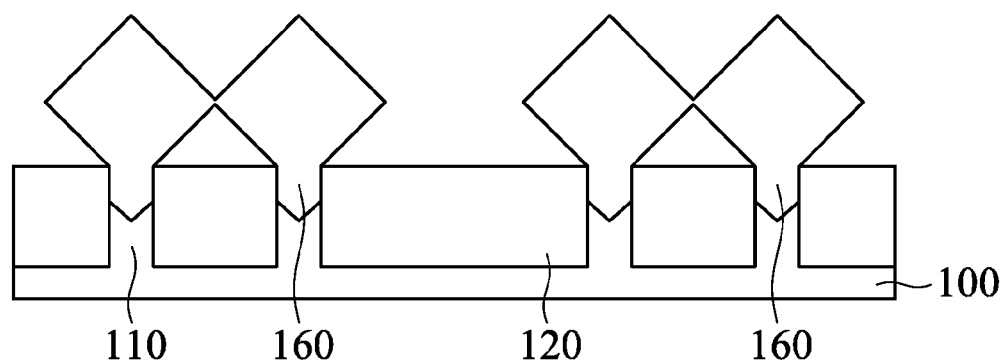
Figure 3B:
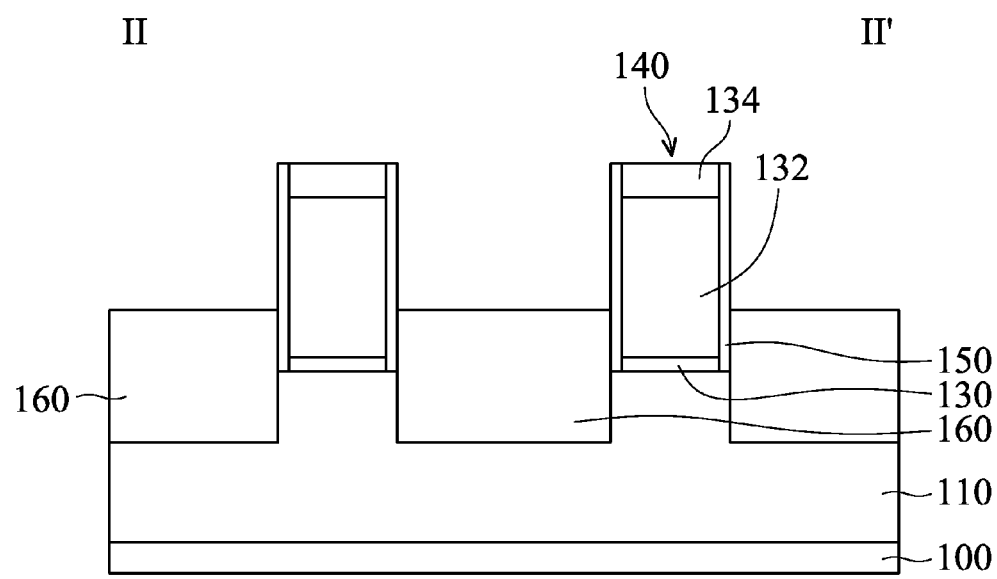

Subsequently, as shown in FIGS. 2B and 3B, source or drain (S/D) structures 160 are formed over the fin structures 110, in accordance with some embodiments. The S/D structures 160 may be used to provide stress or strain to channel regions in the fin structures 110 below the gate stacks 140. As a result, the carrier mobility of the device and device performance are improved.

As shown in FIG. 3B, two of the S/D structures 160 are on opposite sides of one of the gate stacks 140. One of the S/D structures 160 is between two of the gate stacks 140. In some embodiments, the S/D structures 160 adjoin the fin structures 110 and the spacer elements 150. As shown in FIG. 2B, in some embodiments, some of the S/D structures 160 adjoin each other while some of the S/D structures 160 are separated from each other. However, embodiments of the disclosure are not limited thereto. In some other embodiments, the S/D structures 160 are separated from one another.

In some embodiments, some portions of the fin structures 110, which are not covered by the gate dielectric layer 130 and the spacer elements 150, are recessed to be lower than the gate dielectric layer 130. Afterwards, the S/D structures 160 are grown over the fin structures 110 that are recessed, as shown in FIG. 3B. In some embodiments, some portions of the fin structures 110 are recessed to be lower than the top surface of the isolation features 120. As a result, the S/D structures 160, which are grown over the recessed fin structures 110, extend into the isolation features 120, as shown in FIG. 2B. In some embodiments, the S/D structures 160 are diamond shaped due to a crystalline structure, but embodiments of the disclosure are not limited thereto.

In some embodiments, one or more etching operations are performed to recess and remove the upper portions of the fin structures 110. It should be noted that embodiments of the disclosure have many variations. In some other embodiments, the fin structures 110 are not partially removed before the growth of the S/D structures 160.

In some embodiments, a semiconductor material (or two or more semiconductor materials) is epitaxially grown over the fin structures 110 that are recessed. The semiconductor material is growing continually to form the S/D structures 160. In some embodiments, the growth of the S/D structures 160 is performed simultaneously. In some embodiments, the growth of some of the S/D structures 160 is performed separately in different processes.

In some embodiments, the S/D structures 160 are a P-type semiconductor material. For example, the S/D structures 160 may include epitaxially grown silicon or epitaxially grown silicon germanium. The S/D structures 160 are not limited to being a P-type semiconductor material. In some embodiments, the S/D structures 160 are an N-type semiconductor material. The S/D structures 160 may include epitaxially grown silicon, silicon-germanium (SiGe), epitaxially grown phosphorous-doped silicon (SiP), boron-doped silicon germanium (SiGeB) or another suitable epitaxially grown semiconductor material.

In some embodiments, the S/D structures 160 are formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof. The formation process of the S/D structures 160 may use gaseous and/or liquid precursors. In some embodiments, the S/D structures 160 are grown in-situ in the same process chamber. In other words, the S/D structures 160 are formed using an in-situ epitaxial growth process. In some other embodiments, some of the S/D structures 160 are grown separately.

In some embodiments, the S/D structures 160 are doped with one or more suitable dopants. For example, the S/D structures 160 are Si source or drain features doped with phosphorus (P), arsenic (As), or another suitable dopant. Alternatively, the S/D structures 160 are SiGe source or drain features doped with boron (B) or another suitable dopant. In some embodiments, multiple implantation processes are performed to dope the S/D structures 160.

In some embodiments, the S/D structures 160 are doped in-situ during the growth of the S/D structures 160. In some other embodiments, the S/D structures 160 are not doped during the growth of the S/D structures 160. After the epitaxial growth, the S/D structures 160 are doped in a subsequent process. In some embodiments, the doping is achieved using an ion implantation process, a plasma immersion ion implantation process, a gas and/or solid source diffusion process, another applicable process, or a combination thereof. In some embodiments, the S/D structures 160 are further exposed to annealing processes to activate the dopants. For example, a rapid thermal annealing process is performed.

Figure 2C:
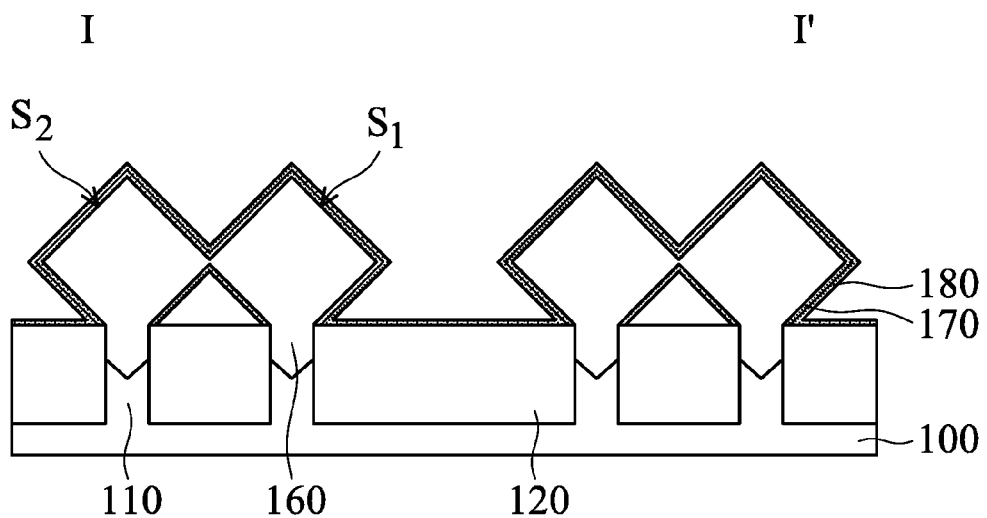
Figure 3C:
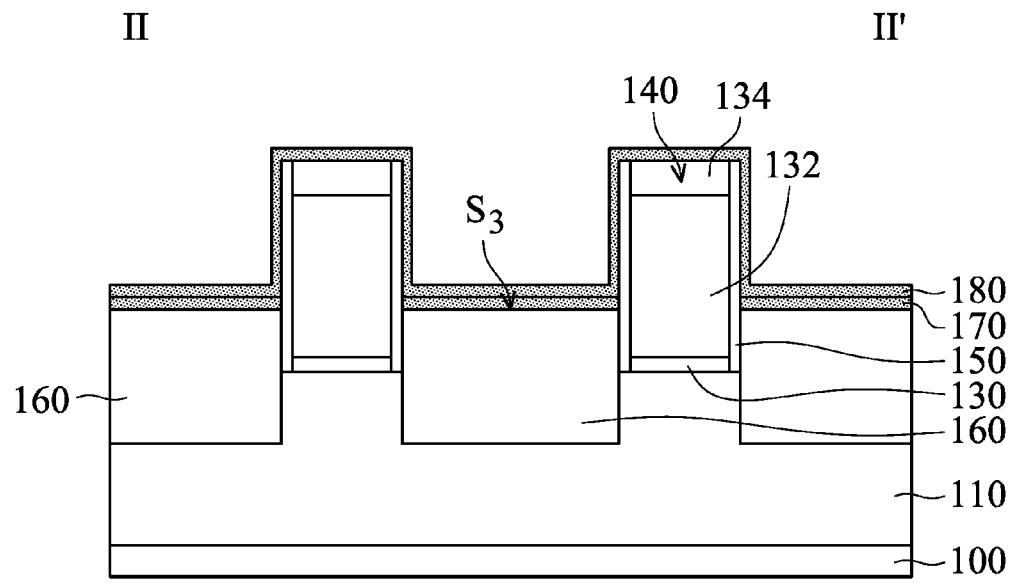

As shown in FIGS. 2C and 3C, a capping layer 170 is deposited over the S/D structures 160, in accordance with some embodiments. The capping layer 170 may be used to assist in a subsequent etching process, which will be described in more detail later. The capping layer 170 coves the surfaces (such as surfaces $S_1$, $S_2$ and $S_3$) of the S/D structures 160 and surrounds the S/D structures 160. In some embodiments, the capping layer 170 is in direct contact with the S/D structures 160. The capping layer 170 does not cover the top surface of the gate stacks 140 and the isolation features 120.

The capping layer 170 may contain a group-IV element, a group-V element, and/or a group-VI element. In some embodiments, the capping layer 170 is made of silicon nitride, silicon oxynitride, silicon carbide, silicon oxycarbide (SiOC), another suitable material, or a combination thereof. In some embodiments, the thickness of the capping layer 170 is in a range from about 5 Å to about 40 Å. In some embodiments, the capping layer 170 is deposited using a CVD process, a PVD process, a spin-on process, another applicable process, or a combination thereof. Many variations and/or modifications can be made to embodiments of the disclosure. In some other embodiments, the capping layer 170 is not formed.

As shown in FIGS. 2C and 3C, a capping layer 180 is deposited over the capping layer 170, in accordance with some embodiments. The capping layer 180 may serve as an etch stop layer during a subsequent etching process, which will be described in more detail later. The capping layer 180 may be referred to as a contact etch stop layer (CESL). The capping layer 180 coves the capping layer 170, the gate stacks 140 and the isolation features 120. In some embodiments, the capping layer 180 is separated from the S/D structures 160 by the capping layer 170. As mentioned above, in some other embodiments, the capping layer 170 is not formed and the capping layer 180 is in direct contact with the S/D structures 160.

The capping layer 180 may contain a group-IV element, a group-V element, and/or a group-VI element. In some embodiments, the capping layer 180 is made of silicon nitride, silicon oxynitride, silicon carbide, silicon oxycarbide, another suitable material, or a combination thereof. In some embodiments, the capping layer 180 and the capping layer 170 are made of the same material. However, embodiments of the disclosure are not limited thereto. The capping layer 180 and the capping layer 170 may be made of different materials. In some embodiments, the thickness of the capping layer 180 is in a range from about 20 Å to about 80 Å. The capping layer 180 and the capping layer 170 may or may not have the same thickness. In some embodiments, the capping layer 180 is deposited using a CVD process, a PVD process, a spin-on process, another applicable process, or a combination thereof.

Figure 2D:
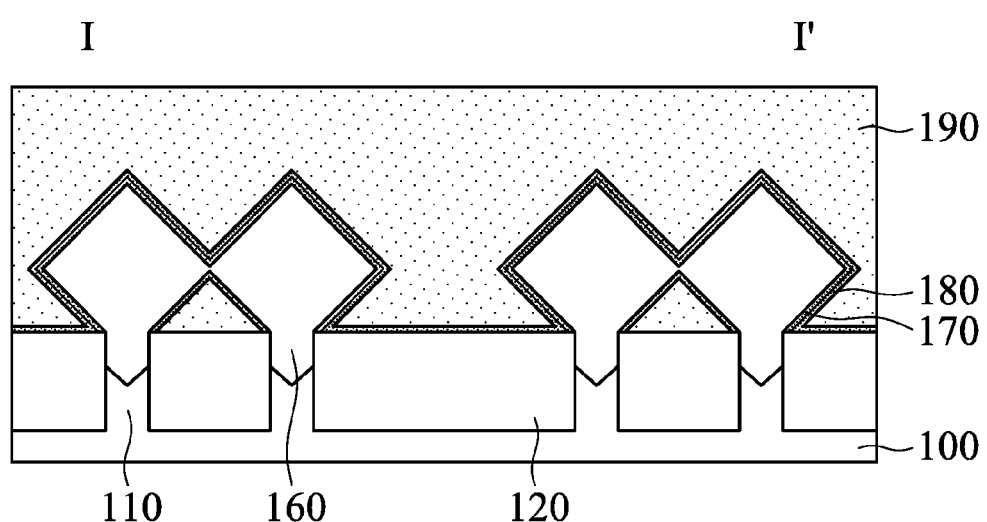
Figure 3D:
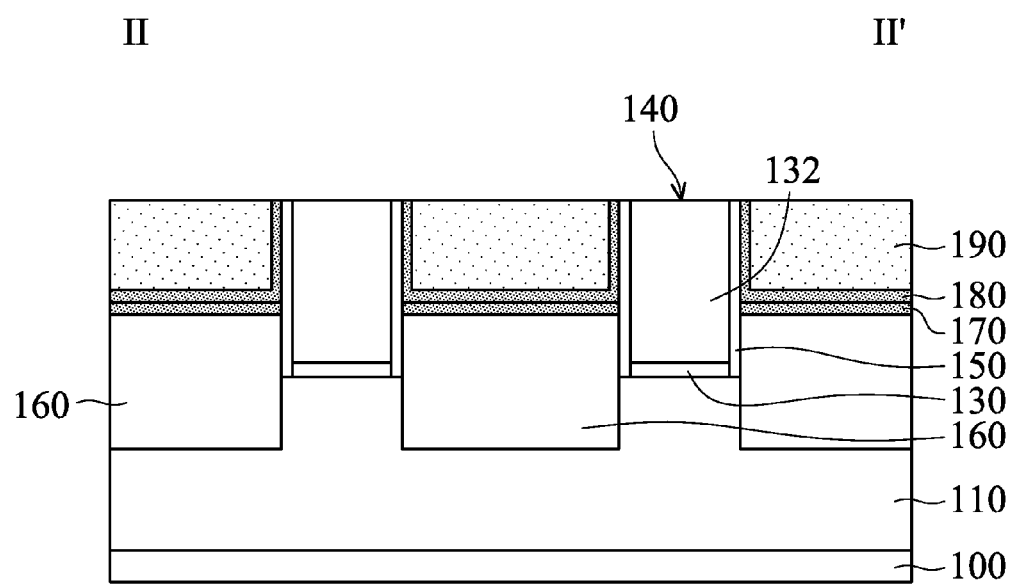

As shown in FIGS. 2D and 3D, a dielectric layer 190 is deposited over the capping layer 180. The dielectric layer 190 surrounds the S/D structures 160 and the gate stacks 140. The dielectric layer 190 may be referred to as an interlayer dielectric (ILD) layer. In some embodiments, the dielectric layer 190 includes silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof. The material of the dielectric layer 190 is selected to minimize propagation delays and crosstalk between nearby conductive features. In some embodiments, the dielectric layer 190 is deposited using a CVD process, a spin-on process, an ALD process, a PVD process, another applicable process, or a combination thereof.

Afterwards, the dielectric layer 190 may be thinned down until the gate stacks 140 are exposed. As a result, some portions of the capping layer 180 over the gate stacks 140 and the spacer elements 150 are removed. In some embodiments, a planarization process is performed to thin down the dielectric layer 190. The planarization process may include a CMP process, a grinding process, an etching process, another applicable process, or a combination thereof. In some embodiments, the etching process includes a dry etching process, a wet etching process or another applicable etching process. In some embodiments, the dielectric layer 190 is thinned down until the gate electrode 132 of the gate stacks 140 is exposed, as shown in FIG. 3D. As a result, the hard mask 134 and the upper portions of the spacer elements 150 are also removed during the planarization process for thinning down the dielectric layer 190.

Figure 3E:
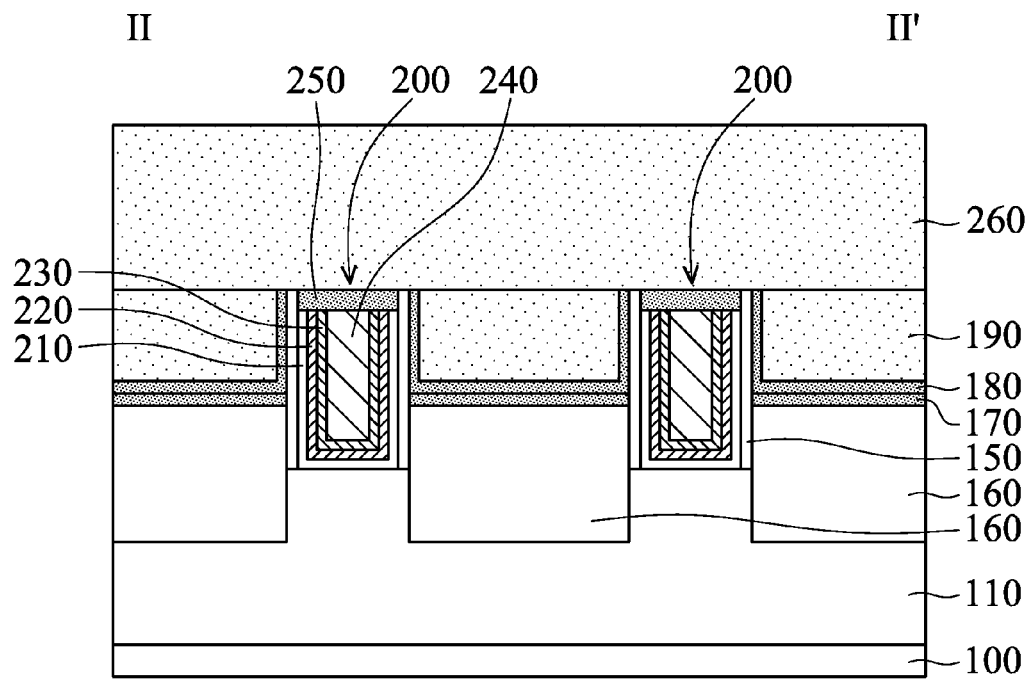

As shown in FIG. 3E, the sacrificial or dummy gate stacks 140 are replaced with gate stacks 200, in accordance with some embodiments. For example, the gate stacks 140 including the gate dielectric layer 130 and the gate electrode 132 are removed. In some embodiments, the gate stacks 140 are removed using a wet etching process, a dry etching process, another applicable process, or a combination thereof. As a result, trenches (not shown) are formed over the semiconductor substrate 100, and the fin structures 110 are partially exposed through the trenches. The exposed portions of the fin structures 110 may serve as channel regions. Afterwards, the gate stacks 200 fill the trenches and cover the exposed portions of the fin structures 110. Many variations and/or modifications can be made to embodiments of the disclosure. In some other embodiments, the gate stacks 140 are active gate stacks and are not replaced with other gate stacks.

In some embodiments, the gate stacks 200 include an interfacial layer, a gate dielectric layer over the interfacial layer, one or more metal gate stacking layers over the gate dielectric layer, and a hard mask over the metal gate stacking layers. Some of these layers of the gate stacks 200 can be replaced or eliminated for different embodiments. Additional layers can be added to form the gate stacks 200. Examples of the metal gate stacking layers include a capping layer (or a barrier layer), a work function layer, a blocking layer, a glue layer, a metal filling layer, another suitable metal gate layer, and combinations thereof. Some of these metal gate stacking layers can be replaced or eliminated for different embodiments. Additional layers can be added to form the metal gate stacking layers.

As an example of the gate stacks 200, a gate dielectric layer 210, a capping layer 220, a work function layer 230, a metal filling layer 240, and a hard mask 250 are shown in figures. However, embodiments of the disclosure are not limited thereto.

As shown in FIG. 3E, the gate dielectric layer 210 is deposited over the fin structures 110, in accordance with some embodiments. In some embodiments, the gate dielectric layer 210 is a high-K dielectric layer. The high-K dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 210 is deposited using an ALD process, a CVD process, a spin-on process, another applicable process, or a combination thereof. In some embodiments, a high-temperature annealing operation is performed to reduce or eliminate defects in the gate dielectric layer 210.

Many variations and/or modifications can be made to embodiments of the disclosure. In some other embodiments, an interfacial layer (not shown) is deposited before the deposition of the gate dielectric layer 210. The interfacial layer may be used to reduce stress between the gate dielectric layer 210 and the fin structures 110. In some embodiments, the interfacial layer includes silicon oxide or another suitable material. In some embodiments, the interfacial layer is formed using an ALD process, a thermal oxidation process, another applicable process, or a combination thereof.

As shown in FIG. 3E, the capping layer 220 is deposited over the gate dielectric layer 210, in accordance with some embodiments. The capping layer 220 may be used to interface the gate dielectric layer 210 with the subsequently formed work function layer 230. The capping layer 220 may be referred to as a barrier layer that is used to prevent diffusion between the gate dielectric layer 210 and the work function layer 230. In some embodiments, the capping layer 220 protects the gate dielectric layer 210 during the annealing operation that is used to reduce or eliminate defects in the gate dielectric layer 210.

In some embodiments, the capping layer 220 is made of a metal-containing material. The metal-containing material may include titanium nitride, tantalum nitride, another suitable material, or a combination thereof. In some embodiments, the capping layer 220 includes multiple layers. In some embodiments, the capping layer 220 is deposited using an ALD process, a PVD process, an electroplating process, an electroless plating process, a CVD process, another applicable process, or a combination thereof. In some other embodiments, the capping layer 220 is not formed.

As shown in FIG. 3E, the work function layer 230 is deposited over the capping layer 220, in accordance with some embodiments. The work function layer 230 is used to provide the desired work function for transistors to enhance device performance including improved threshold voltage (Vt). In the embodiments of forming an NMOS transistor, the work function layer 230 can be an N-type metal layer. The N-type metal layer is capable of providing a work function value suitable for the device. The work function value may be substantially equal to or less than about 4.5 eV. The N-type metal layer may include metal, metal carbide, metal nitride, or a combination thereof. For example, the N-type metal layer includes titanium nitride, tantalum, tantalum nitride, another suitable material, or a combination thereof.

On the other hand, in the embodiments of forming a PMOS transistor, the work function layer 230 can be a P-type metal layer. The P-type metal layer is capable of providing a work function value suitable for the device. The work function value may be substantially equal to or greater than about 4.8 eV. The P-type metal layer may include metal, metal carbide, metal nitride, other suitable materials, or a combination thereof. For example, the P-type metal includes tantalum nitride, tungsten nitride, titanium, titanium nitride, other suitable materials, or a combination thereof.

The work function layer 230 may also be made of hafnium, zirconium, titanium, tantalum, aluminum, metal carbides (e.g., hafnium carbide, zirconium carbide, titanium carbide, aluminum carbide), metal nitrides, ruthenium, palladium, platinum, cobalt, nickel, conductive metal oxides, or a combination thereof. The thickness and/or the compositions of the work function layer 230 may be fine-tuned to adjust the work function level. For example, a titanium nitride layer may be used as a P-type metal layer or an N-type metal layer, depending on the thickness and/or the compositions of the titanium nitride layer. In the embodiments, the work function layer 230 has a multi-layer structure.

As shown in FIG. 3E, the metal filling layer 240 is deposited over the work function layer 230, in accordance with some embodiments. In some embodiments, the metal filling layer 240 includes tungsten, aluminum, copper, cobalt, another suitable material, or a combination thereof. In some embodiments, the metal filling layer 240 is deposited using a PVD process, a CVD process, an electroplating process, an electroless plating process, another applicable process, or a combination thereof. In some other embodiments, the metal filling layer 240 is not formed.

Many variations and/or modifications can be made to embodiments of the disclosure. In some other embodiments, a blocking layer and/or a glue layer (not shown) is deposited over the work function layer 230 before the deposition of the metal filling layer 240. The blocking layer may be used to prevent the metal filling layer 240 from diffusing or penetrating into the work function layer 230. The glue layer may be used to increase the adhesion between the work function layer 230 and the metal filling layer 240. As a result, the metal filling layer 240 is prevented from peeling or delamination. In some embodiments, the blocking layer and/or the glue layer is made of tantalum nitride, titanium nitride, another suitable material, or a combination thereof. In some embodiments, the blocking layer and/or the glue layer is deposited using an ALD process, a PVD process, an electroplating process, an electroless plating process, another applicable process, or a combination thereof.

In some embodiments, the gate dielectric layer 210, the capping layer 220, and the work function layer 230 are deposited conformally while the metal filling layer 240 is deposited non-conformally. The gate dielectric layer 210, the capping layer 220, the work function layer 230, and the metal filling layer 240 together fill the trenches, which are formed due to the removal of the gate stacks 140. In some embodiments, portions of the gate dielectric layer 210, the capping layer 220, the work function layer 230, and the metal filling layer 240 outside of the trenches are removed using a planarization process. The planarization process may include a CMP process, a grinding process, an etching process, another applicable process, or a combination thereof.

Afterwards, the gate dielectric layer 210, the capping layer 220, the work function layer 230, and the metal filling layer 240 remaining in the trenches may be recessed. The hard mask 250 is formed between the spacer elements 150 and covers the recessed gate dielectric layer 210, the capping layer 220, the work function layer 230, and the metal filling layer 240. As a result, the gate dielectric layer 210, the capping layer 220, the work function layer 230, the metal filling layer 240, and the hard mask 250 between the spacer elements 150 together form the gate stacks 200, as shown in FIG. 3E.

In some embodiments, the hard mask 250 includes silicon nitride, silicon oxynitride, another suitable material, or a combination thereof. In some embodiments, the hard mask 250 is deposited using a CVD process, a PVD process, a spin-on process, another applicable process, or a combination thereof. In some embodiments, portions of the hard mask 250 outside of the trenches between the spacer elements 150 are removed using a planarization process. The planarization process may include a CMP process, a grinding process, an etching process, another applicable process, or a combination thereof.

However, embodiments of the disclosure are not limited thereto. In some other embodiments, the hard mask 250 is not formed. The gate dielectric layer 210, the capping layer 220, the work function layer 230, and the metal filling layer 240 remaining in the trenches are not recessed. As a result, the gate dielectric layer 210, the capping layer 220, the work function layer 230, and the metal filling layer 240 between the spacer elements 150 together form the gate stacks 200.

Figure 2E:
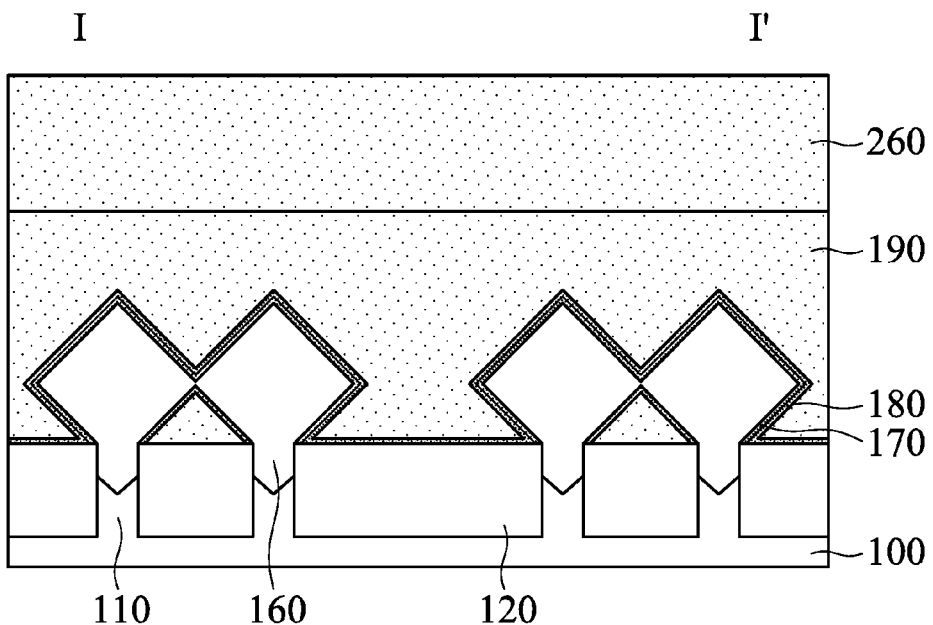

As shown in FIGS. 2E and 3E, a dielectric layer 260 is deposited over the dielectric layer 190 and covers the gate stacks 200, in accordance with some embodiments. The dielectric layer 260 may be referred to as an ILD layer. In some embodiments, the dielectric layer 260 includes silicon oxide, silicon oxynitride, BSG, PSG, BPSG, FSG, low-K material, porous dielectric material, another suitable dielectric material, or a combination thereof. The material of the dielectric layer 260 is selected to minimize propagation delays and crosstalk between nearby conductive features. In some embodiments, the dielectric layer 260 is deposited using a CVD process, a spin-on process, an ALD process, a PVD process, another applicable process, or a combination thereof.

Figure 2F:
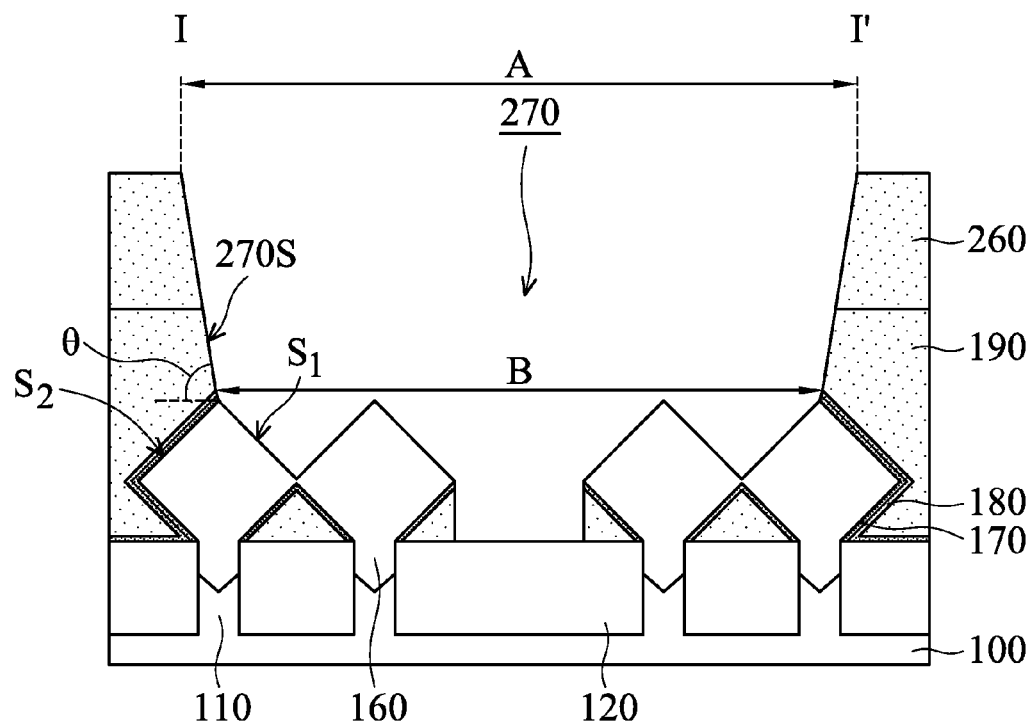
Figure 3F:
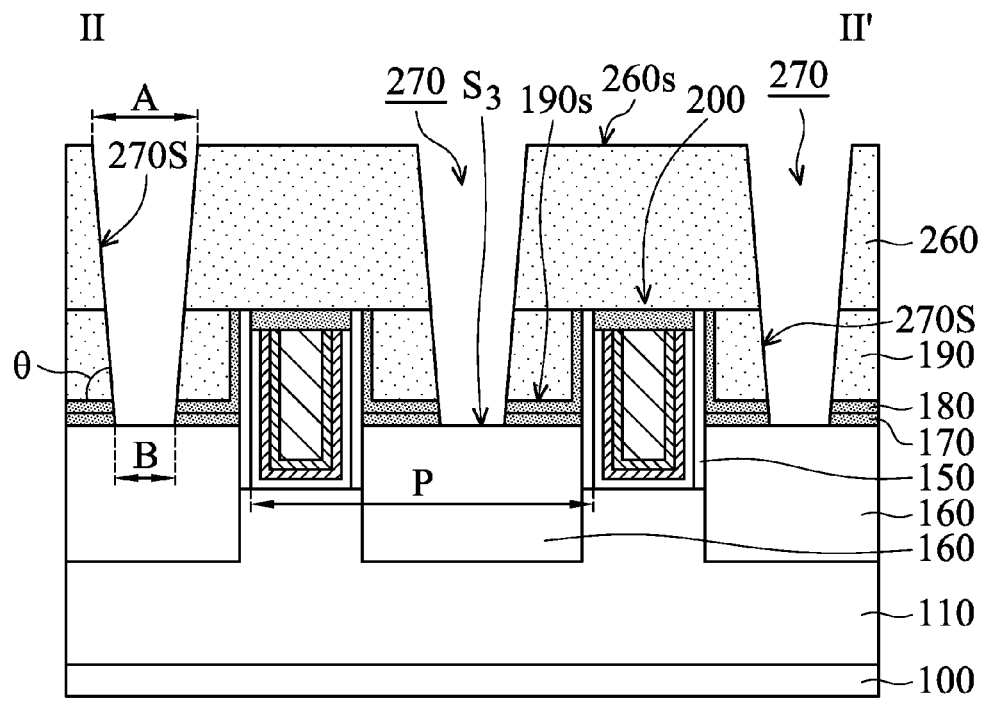

As shown in FIGS. 2F and 3F, multiple trenches (or openings) 270 are formed in the dielectric layer 190 and the dielectric layer 260, in accordance with some embodiments. The trenches 270 may extend along the Y-axis (shown in FIG. 1) and are arranged in a direction that is substantially parallel to the X-axis (shown in FIG. 1). In some embodiments, the trenches 270 penetrate through the dielectric layer 260, the dielectric layer 190, the capping layer 180 and the capping layer 170 to expose the S/D structures 160. The trenches 270 partially expose the S/D structures 160. For example, the surfaces $S_1$ and $S_3$ of the S/D structures 160 are partially exposed through the trenches 270. In some embodiments, the surface $S_2$ of the S/D structures 160 is covered by the capping layer 170 and the capping layer 180 without being exposed through the trenches 270, as shown in FIG. 2F.

In some embodiments, one of the trenches 270 partially exposes multiple S/D structures 160 and the isolation features 120. As a result, the fabrication time and cost of the trenches 270 is lowered. More specifically, when one of the trenches 270 exposes one of the S/D structures 160, two or more than two photolithography processes may be required during the formation of the trenches 270. On the other hand, when one of the trenches 270 exposes multiple S/D structures 160, there may be fewer photolithography processes (such as one photolithography process) required for forming the trenches 270. In some embodiments, one of the trenches 270 exposes multiple S/D structures 160, while there are also one or more trenches 270 exposing one of the S/D structures 160.

Although FIG. 2F shows that one of the trenches 270 partially exposes four S/D structures 160, embodiments of the disclosure are not limited thereto. In some other embodiments, one of the trenches 270 partially exposes either fewer than four or more than four S/D structures 160. For example, one of the trenches 270 may partially expose one or two of the S/D structures 160. Alternatively, one of the trenches 270 may partially expose six or more S/D structures 160. In some other embodiments, the dielectric layer 190 between the S/D structures 160 is not removed, and the isolation features 120 remain covered by the dielectric layer 190.

As shown in FIGS. 2F and 3F, the trenches 270 have an inverted tapered (inverted trapezoidal) profile, in accordance with some embodiments. The inverted tapered profile has a greater width at the top than at the bottom. For example, the trenches 270 have a greater width A at the top than the width B at the bottom over the S/D structures 160, as shown in FIGS. 2F and 3F. In other words, the trenches 270 shrink from top to bottom. In some embodiments, the trenches 270 gradually shrink along a direction from the S/D structures 160 towards the fin structures 110. In some embodiments, the inverted tapered profile has an angle in a range from about 80 degrees to about 89 degrees. For example, the trenches 270 have inclined sidewalls 270S. The sidewalls 270S have an angle θ in a range from about 80 degrees to about 89 degrees with reference to the X-Y plane. Embodiments of the disclosure are not limited. In some other embodiments, the trenches 270 have another cross-sectional profile. For example, the width A of the trenches 270 may be substantially equal to the width B of the trenches 270, and the trenches 270 may have vertical sidewalls 270S.

In some embodiments, an etching process is used to partially remove the dielectric layer 260, the dielectric layer 190, the capping layer 180 and the capping layer 170 so as to form the trenches 270. The etching process may be an anisotropic etching process. In some embodiments, the etching process includes a dry etching process (such as a plasma etching process) or another applicable etching process. In some embodiments, the etchant used in the etching process contains carbon and fluorine or another suitable etching gas. For example, the etchant used in the etching process may include tetrafluoromethane ($CF_4$), fluoromethane ($CH_3F$), hexa-fluoro-butadiene ($C_4F_6$), or another suitable etching gas.

In some embodiments, the dielectric layer 260 and the dielectric layer 190 have an etching rate that is much higher than an etching rate of the capping layer 180. Therefore, the capping layer 180 serves as an etch stop layer during the etching process for forming the trenches 270. In some embodiments, a patterned mask layer (not shown) is formed over the dielectric layer 260 to assist in the etching process for forming the trenches 270. After the etching process, the patterned mask layer is removed.

Figure 2G:
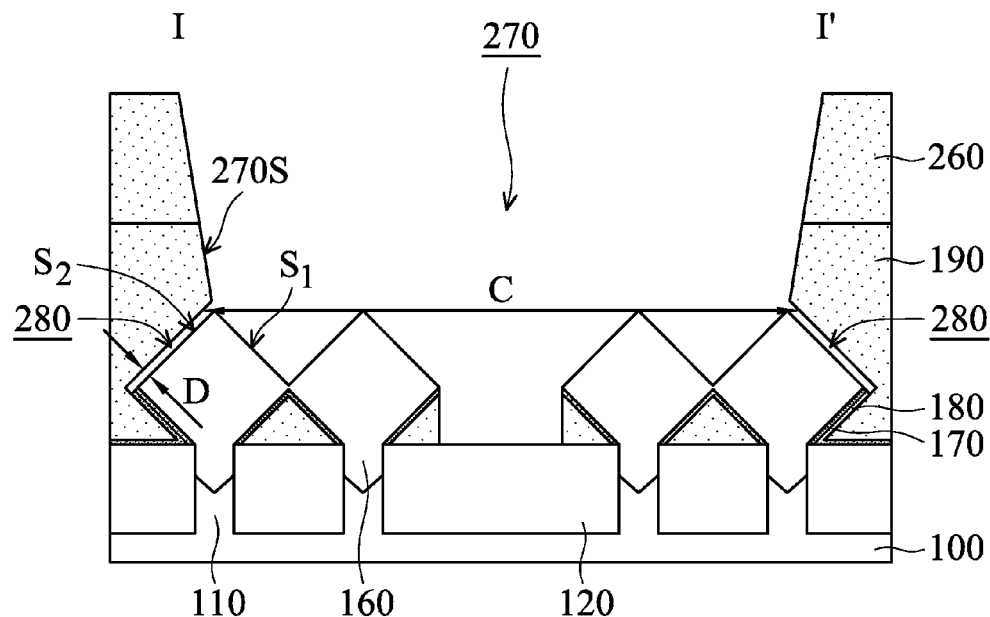
Figure 3G:
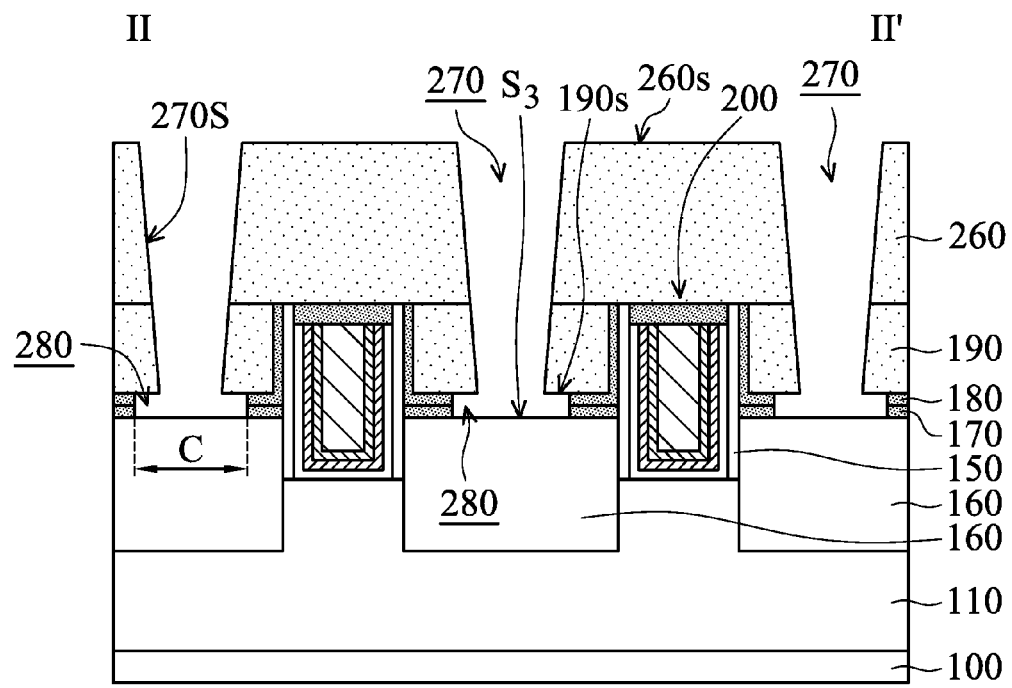

As shown in FIGS. 2G and 3G, the capping layer 170 and the capping layer 180 covering the S/D structures 160 are partially removed, in accordance with some embodiments. The surface $S_2$ of the S/D structures 160, which was previously covered by the capping layer 170 and the capping layer 180, becomes exposed. Some portions of the surface $S_3$ of the S/D structures 160, which was previously covered by the capping layer 170 and the capping layer 180, also become exposed. As a result, multiple openings (or recesses) 280 are formed between the S/D structures 160 and the dielectric layer 190.

As shown in FIGS. 2G and 3G, the openings 280 are in connection with or communicate with the trenches 270. The openings 280 extend downward from the sidewalls 270S of the trenches 270 along the surface $S_2$ of the S/D structures 160, as shown in FIG. 2G. The openings 280 also extend from the sidewalls 270S of the trenches 270 along the surface $S_3$ of the S/D structures 160 towards the gate stacks 200, as shown in FIG. 3G. As a result, the openings 280 and the trenches 270 together form an inverted T-shaped profile, as shown in FIG. 3G in accordance with some embodiments. Many variations and/or modifications can be made to embodiments of the disclosure. The openings 280 may extend from the sidewalls 270S of the trenches 270 to the spacer elements 150 until the spacer elements 150 are partially exposed.

There is a distance D in the openings 280. The distance D is between the S/D structures 160 and the dielectric layer 190, and is substantially equal to the sum of the thicknesses of the capping layer 170 and the capping layer 180. The openings 280 have a width C that is greater than the width B of the trenches 270 shown in FIGS. 2F and 3F. The width C of the openings 280 may be substantially equal to, less than, or greater than the width A of the trenches 270 shown in FIGS. 2F and 3F.

In some embodiments, an etching process is used to partially remove the capping layer 170 and the capping layer 180 so as to form the openings 280. The etching process may be an isotropic etching process. In some embodiments, the etching process includes a wet etching process or another applicable etching process. In some embodiments, the capping layer 170 and the capping layer 180 are etched faster than the dielectric layer 260 and the dielectric layer 190 during the etching process forming the openings 280. In some embodiments, an etching rate of the dielectric layer 260 and the dielectric layer 190 during the formation of the trenches 270 is higher than an etching rate of the dielectric layer 260 and the dielectric layer 190 during the formation of the openings 280.

In some embodiments, the etchant used in the etching process forming the openings 280 contains phosphoric acid or another suitable etching solution. The etchant is selected according to the materials of the capping layer 170, the capping layer 180, the dielectric layer 260, and the dielectric layer 190. For example, the capping layer 170 and the capping layer 180 include nitride while the dielectric layer 260 and the dielectric layer 190 include oxide. Therefore, the etchant used in the etching process for forming the openings 280 is selected to have a sufficiently high etch selectivity of nitride to oxide. In some embodiments, the etchant used in the etching process for forming the openings 280 has an etch selectivity in a range from about 3 to about 100.

Since the etchant used in the etching process for forming the openings 280 has a sufficiently high etch selectivity of the capping layer 170 and the capping layer 180 to the dielectric layer 260 and the dielectric layer 190, no mask layer is required during the etching process. Therefore, the openings 280 may be referred to as self-aligned trenches. In some embodiments, the capping layer 170 and the capping layer 180 have an etching rate that is much higher than an etching rate of the S/D structures 160. Therefore, the S/D structures 160 may be used as an etch stop layer during the etching process for forming the openings 280. In some embodiments, the isolation features 120 are not removed during the formation of the openings 280 to prevent current leakage.

In some embodiments, the formation of the capping layer 170 enlarges the distance D between the S/D structures 160 and the dielectric layer 190. It is easier for the etchant used in the etching process for forming the openings 280 to flow or spread between the S/D structures 160 and the dielectric layer 190. There is also a greater surface area of the capping layer 180 exposed to the etchant. Accordingly, it can be ensured that the capping layer 170 and the capping layer 180 covering the S/D structures 160 are cleanly removed without residue. As a result, the openings 280 create more space for forming conductive contacts connected to the S/D structures 160, which will be described in more detail later.

Many variations and/or modifications can be made to embodiments of the disclosure. In some other embodiments, the dielectric layer 190 and the dielectric layer 260 are partially removed to form the trenches 270. The capping layer 170 and the capping layer 180 are not removed during the formation of the trenches 270 so that the S/D structures 160 are not exposed. Afterwards, the capping layer 170 and the capping layer 180 remaining over the S/D structures 160 are removed to form the openings 280 exposing the S/D structures 160.

Figure 2H:
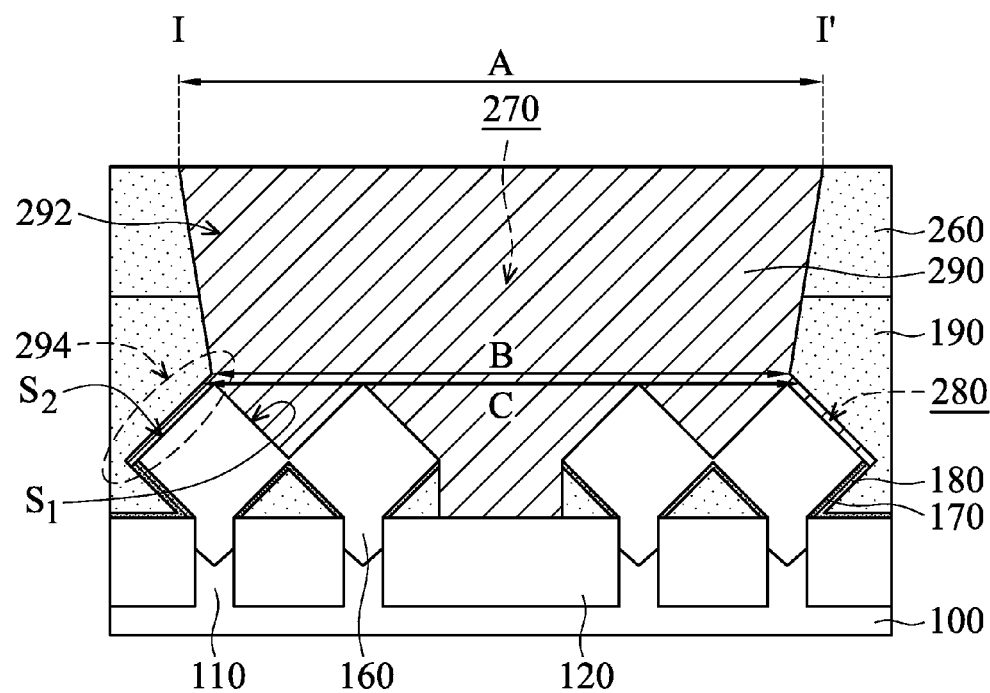
Figure 3H:
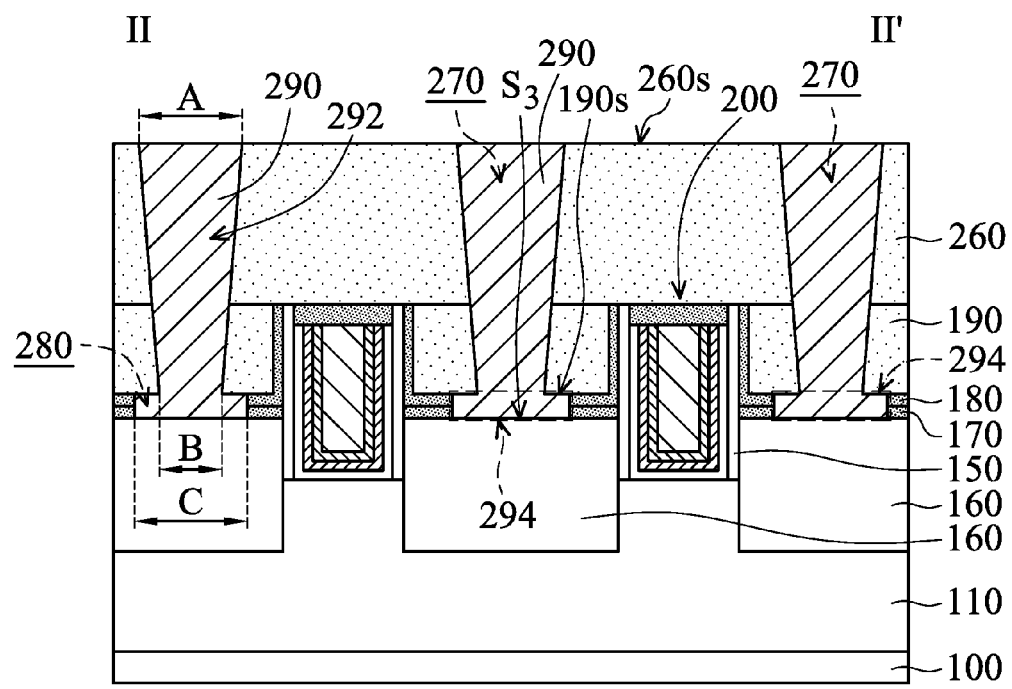

As shown in FIGS. 2H and 3H, conductive contacts 290 are formed to electrically connect to the S/D structures 160, in accordance with some embodiments. In some embodiments, a conductive material layer is deposited over the dielectric layer 260 to fill the trenches 270 and the openings 280. A planarization process is subsequently used to remove portions of the conductive material layer outside of the trenches 270 and the openings 280. As a result, the remaining portions of the conductive material layer in the trenches 270 and the openings 280 form the conductive contacts 290. In some embodiments, the conductive contacts 290 adjoin multiple S/D structures 160 and the isolation features 120. In some embodiments, a portion of the conductive contacts 290 is sandwiched between the surface $S_2$ of the S/D structures 160 and the dielectric layer 190.

In some embodiments, the conductive material layer is made of tungsten, aluminum, copper, gold, platinum, titanium, another suitable material, or a combination thereof. In some embodiments, the conductive material layer is deposited using a CVD process, a PVD process, an electroplating process, an electroless plating process, another applicable process, or a combination thereof.

As shown in FIGS. 2H and 3H, the conductive contacts 290 have portions 292 and 294, in accordance with some embodiments. The portion 292 extends from the top surface 260S of the dielectric layer 260 to the bottom surface 190S of the dielectric layer 190. In some embodiments, the portion 292 gradually shrinks along a direction from the fin structures 110 towards the semiconductor substrate 100. The portion 292 has a width A at the top surface 260S of the dielectric layer 260. The portion 292 also has a width B at the bottom surface 190S of the dielectric layer 190. In some embodiments, the width A is greater than the width B adjoining the portion 294. The width A may be substantially equal to the width B adjoining the portion 294.

In some embodiments, the portion 294 extends downward from the portion 292 to adjoin the S/D structures 160. The portion 294 extends from the bottom surface 190S of the dielectric layer 190 to the surfaces $S_1$, $S_2$ and $S_3$ of the S/D structures 160. In some embodiments, the portion 294 protrudes from the portion 292 towards the gate stacks 200 and the isolation features 120. In some embodiments, there is an angle (i.e., the angle θ shown in FIGS. 2F and 3F) between the portion 294 and the portion 292. In some embodiments, the angle between the portion 294 and the portion 292 is in a range from about 80 degrees to about 89 degrees. However, embodiments of the disclosure are not limited thereto.

The portion 294 has a width C at the bottom surface 190S of the dielectric layer 190 and the surfaces $S_1$, $S_2$ and $S_3$ of the S/D structures 160. In some embodiments, the width C of the portion 294 is greater than the width B of the portion 292. Accordingly, the portion 294 may be referred to as an enlarged (or broad) portion or a protruding portion. The width C of the portion 294 may be substantially equal to, less than, or greater than the width A of the portion 292.

In some cases, as the pitch between gates is reduced to minimize the semiconductor device, the size of conductive contacts is limited. More specifically, a conductive contact is connected to a S/D structure between two gates. When the pitch between the gates is reduced, the width of the conductive contact may need to be reduced to prevent short circuiting between the gates and the conductive contact. As a result, the contact area for electrical connection between the conductive contact and the S/D structure is reduced. The contact resistance of the semiconductor device may be undesirably increased. In addition, photolithography, etching and deposition processes are used to form the conductive contact. There may be minor process variations during the formation of the conductive contact. For example, the process variations may include the overlay or shift of the photomask used in a photolithography process or any possible variation in an etching process. The width of the conductive contact may be reduced to avoid defects in the semiconductor device induced by process variations.

In accordance with some embodiments, the trenches 270 for forming conductive contacts are formed. Afterwards, the capping layer 170 and the capping layer 180 covering the S/D structures 160 are removed to form the openings 280 that communicate with the trenches 270. The trenches 270 and the openings 280 are then filled with a conductive material layer to form the conductive contacts 290. As a result, the openings 280 broaden the space available for forming conductive contacts 290. The contact area for electrical connection between the conductive contacts 290 and the S/D structures 160 is significantly enlarged. Therefore, the contact resistance of the semiconductor device structure is reduced and the operation speed of the semiconductor device structure is enhanced.

Furthermore, as a result of the openings 280, the conductive contacts 290 have the enlarged portion 294 with a width C. Even if the width B of the trenches 270 is limited due to there being a small pitch P between the gate stacks 140 and/or possible process variations during the formation of the trenches 270, it can be ensured that there is sufficient contact area for electrical connection between the conductive contacts 290 and the S/D structures 160.

In addition, the size of the enlarged portion 294 of the conductive contacts 290 may be varied according to the size of the openings 280. The contact area for electrical connection between the conductive contacts 290 and the S/D structures 160 are tunable according to requirements. For example, the contact area between the conductive contacts 290 and the S/D structures 160 is allowed to be increased. Therefore, embodiments of the disclosure provide a semiconductor device structure having improved device performance and good reliability.

Figure 3I:
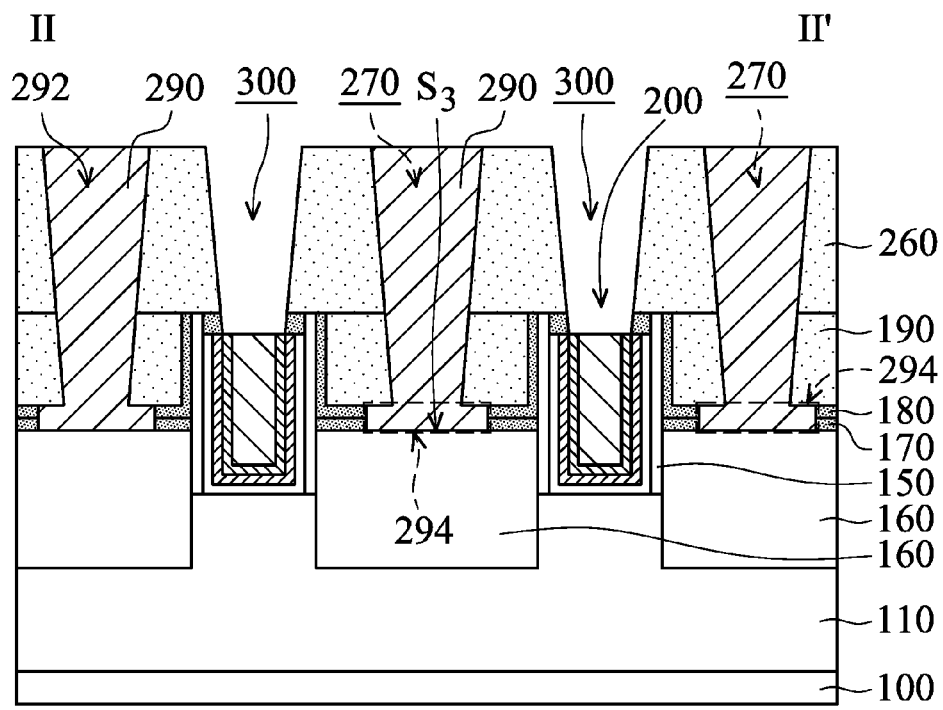

Afterwards, as shown in FIG. 3I, multiple openings 300 are formed in the dielectric layer 260, in accordance with some embodiments. The openings 300 penetrate through the dielectric layer 260 to partially expose the gate stacks 200. For example, the openings 300 penetrate through the hard mask 250 of the gate stacks 200 so that the work function layer 230 and the metal filling layer 240 are exposed through the openings 300. In some embodiments, the openings 300 have an inverted tapered profile. In some embodiments, the openings 300 gradually shrink along a direction from the gate stacks 200 towards the fin structures 110. However, embodiments of the disclosure are not limited thereto. In some other embodiments, the openings 300 have another cross-sectional profile.

In some embodiments, an etching process is used to partially remove the dielectric layer 260 so as to form the openings 300. The etching process may be an anisotropic etching process. In some embodiments, the etching process includes a dry etching process (such as a plasma etching process) or another applicable etching process. In some embodiments, the etchant used in the etching process contains carbon and fluorine or another suitable etching gas. For example, the etchant used in the etching process may include $CF_4$, $CH_3F$, $C_4F_6$, or another suitable etching gas. In some embodiments, a patterned mask layer (not shown) is formed over the dielectric layer 260 to assist in the etching process for forming the openings 300. After the etching process, the patterned mask layer is removed.

As shown in FIG. 3I, conductive contacts 310 are formed to electrically connect to the gate stacks 200, in accordance with some embodiments. In some embodiments, a conductive material layer is deposited over the dielectric layer 260 to fill the openings 300. A planarization process is subsequently used to remove portions of the conductive material layer outside of the openings 300. As a result, the remaining portions of the conductive material layer in the openings 300 form the conductive contacts 310. In some embodiments, the conductive material layer is made of tungsten, aluminum, copper, gold, platinum, titanium, another suitable material, or a combination thereof. In some embodiments, the conductive material layer is deposited using a CVD process, a PVD process, an electroplating process, an electroless plating process, another applicable process, or a combination thereof.

Figure 3J:
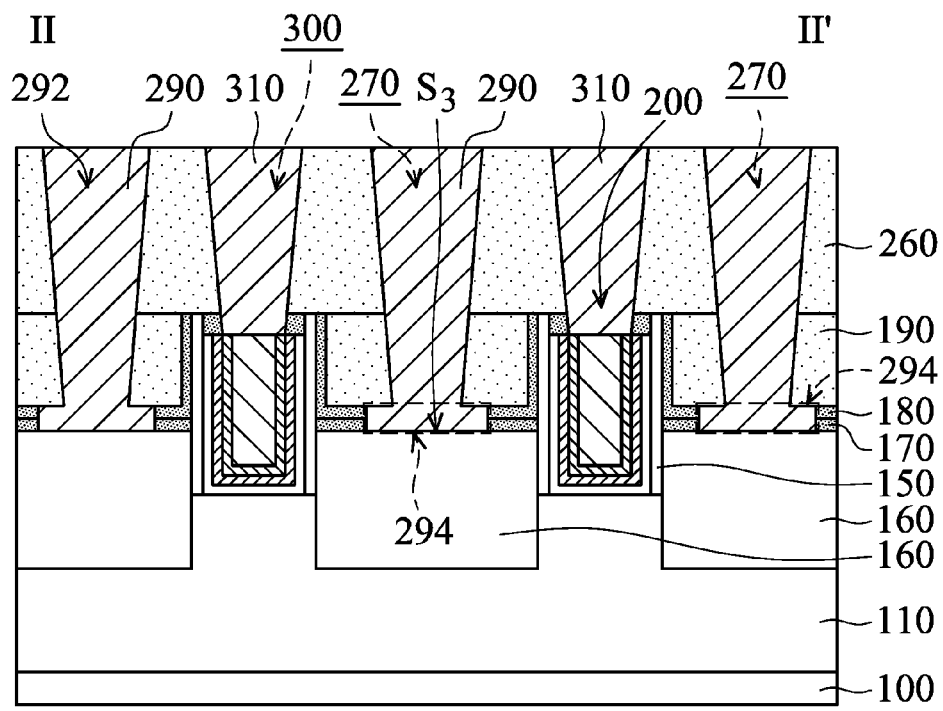

Many variations and/or modifications can be made to embodiments of the disclosure. FIGS. 2H and 3J show that the conductive contacts 290 connected to the S/D structures 160 have the enlarged portion 294, but embodiments of the disclosure are not limited. In some other embodiments, the conductive contacts 310 connected to the gate stacks 200 have enlarged portions. In some other embodiments, both the conductive contacts 290 and 310 have enlarged portions. Embodiments of the disclosure can be applied to a semiconductor device structure with any suitable conductive contacts, which are connected to S/D structures, gate stacks, other suitable conductive features, or a combination thereof.

For example, in some other embodiments, the hard mask 250 of the gate stacks 200 is further removed after the formation of the openings 300. As a result, multiple openings (not shown), which are similar to the openings 280, are formed between the gate stacks 200 and the dielectric layer 260 to create more space for forming the conductive contacts 310. These openings may expose the capping layer 220 of the gate stacks 200. These openings may also expose the gate dielectric layer 210 of the gate stacks 200. Accordingly, the subsequently formed conductive contacts 310 have enlarged portions (not shown). The contact resistance between the conductive contacts 310 and the gate stacks 200 is reduced.

Subsequently, various features will be formed over the dielectric layer 260 and the conductive contacts 290 and 310. Some of the various features are electrically connected to the gate stacks 200 and the S/D structures 160 through the conductive contacts 290 and 310. The various features may include interconnection layers, vias and other suitable features.

Embodiments of the disclosure can be applied to not only a semiconductor device structure with N-type or P-type transistors but also a semiconductor device structure with complementary transistors. Embodiments of the disclosure are not limited and may be applied to fabrication processes for any suitable technology generation. Various technology generations include a 16 nm node, a 10 nm node, a 7 nm node, a 5 nm node, or another suitable node.

Figure 4:
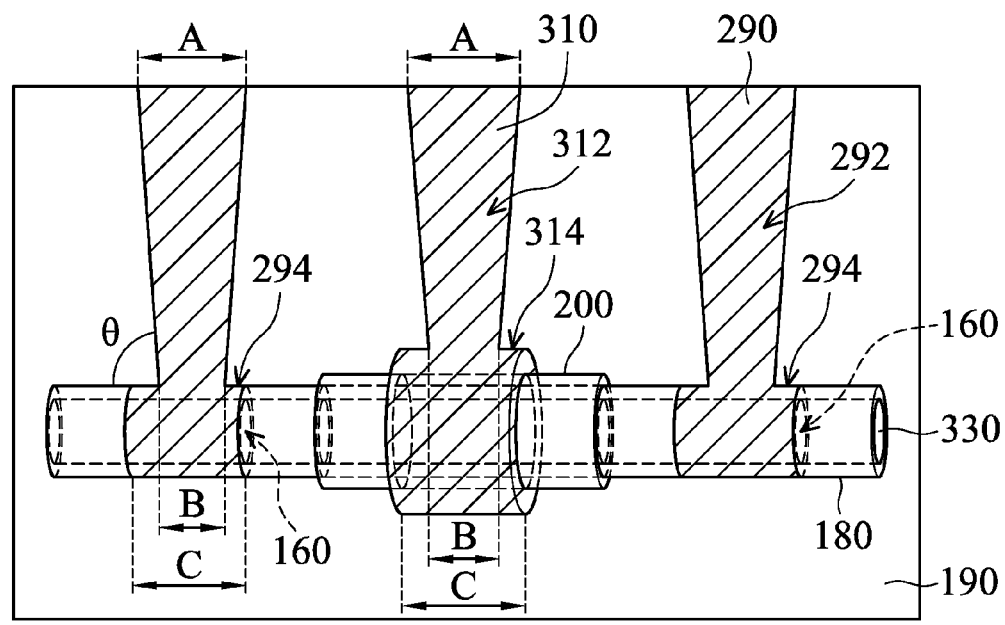
FIG. 4 is a perspective view of a semiconductor device structure, in accordance with some embodiments.
Figure 5:
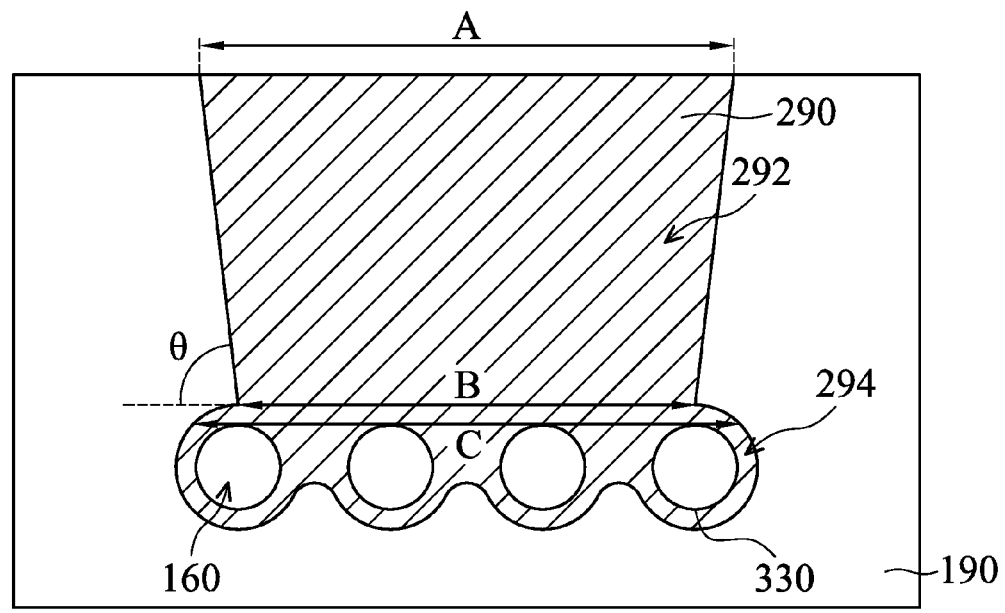
FIG. 5 is a cross-sectional view of a semiconductor device structure, in accordance with some embodiments.

Furthermore, embodiments of the disclosure can be applied to not only a semiconductor device structure with a fin field-effect transistor (FinFET) but also a semiconductor device structure with a gate-all-around (GAA) FET or another suitable FET. In some embodiments, the materials and/or formation methods of a semiconductor device structure with a GAA FET are the same as or similar to those of the described semiconductor device structure with a FinFET, and are therefore not repeated. FIG. 4 is a perspective view of a semiconductor device structure, in accordance with some embodiments. FIG. 5 is a cross-sectional view of a semiconductor device structure, in accordance with some embodiments. FIGS. 4 and 5 show a semiconductor device structure with GAA FETs as an example, but embodiments of the disclosure are not limited thereto.

As shown in FIGS. 4 and 5, the semiconductor device structure includes multiple semiconductor features 330, gate stacks including a gate stack 200, S/D structures 160, conductive contacts 290 and 310, a capping layer 180, and a dielectric layer 190, in accordance with some embodiments. The semiconductor features 330 are in the dielectric layer 190. The semiconductor features 330 have a channel region, which is surrounded by the gate stack 200, and S/D regions (i.e., the S/D structures 160). In some embodiments, the semiconductor features 330 are partially surrounded by the capping layer 180. In some other embodiments, there is a capping layer (not shown) sandwiched between the semiconductor features 330 and the capping layer 180.

In some embodiments, the semiconductor features 330 include silicon or another elementary semiconductor material such as germanium. In some other embodiments, the semiconductor features 330 include a compound semiconductor. The compound semiconductor may include gallium arsenide, silicon carbide, indium arsenide, indium phosphide, another suitable compound semiconductor, or a combination thereof.

As shown in FIGS. 4 and 5, two of the S/D structures 160 are on opposite sides of the gate stack 200, and the conductive contacts 290 and 310 are in dielectric layer 190. The conductive contacts 290 and 310 extend to connect to the S/D structures 160 and gate stack 200, respectively. In some embodiments, the conductive contacts 290 have portions 292 and 294, and the conductive contacts 310 have portions 312 and 314. The portions 292 and 312 may have an inverted tapered profile, but embodiments of the disclosure are not limited thereto. In some embodiments, the inverted tapered profile has an angle $\theta$ in a range from about 80 degrees to about 89 degrees. In some embodiments, the portions 292 and 312 have a width A and a width B that is less than the width A.

In some embodiments, the portion 294 continuously surrounds one of the S/D structures 160, as shown in FIG. 4. In some embodiments, the portion 294 continuously surrounds multiple S/D structures 160, as shown in FIG. 5. In some embodiments, the portion 294 has a width C that is greater than the width B of the portion 292. The portion 314 continuously surrounds the gate stack 200. In some embodiments, the portion 314 has a width C that is greater than the width B of the portion 312. The portions 294 and 314 may be referred to as an enlarged portion.

According to the embodiments of FIGS. 4 and 5, the contact areas for electrical connection between the conductive contacts 290 and the S/D structures 160 and between the conductive contacts 310 and the gate stack 200 are significantly enlarged. Therefore, the contact resistance of the semiconductor device structure with GAA FETs is reduced.

Embodiments of the disclosure form a semiconductor device structure with a low contact resistance. The semiconductor device structure includes a conductive contact, which is connected to a source or drain (S/D) structure or a gate stack. The conductive contact includes an enlarged portion in direct contact with the S/D structure or the gate stack. As a result, the contact area for electrical connection between the conductive contact and the S/D structure or between the conductive contact and the gate stack is broadened. The contact resistance of the semiconductor device structure is reduced and the operation speed of the semiconductor device structure is improved. Therefore, the device performance of the semiconductor device structure is significantly enhanced.

In addition, the formation of the conductive contact includes forming a trench and then forming an opening. The opening is in connection with the trench and laterally extends from the bottom of the trench. The opening creates a space for forming the enlarged portion of the conductive contact. Afterwards, the trench and the opening are filled with a conductive material layer to form the conductive contact. Accordingly, the size (such as the width) of the enlarged portion of the conductive contact can be varied according to the size of the opening. Therefore, the contact area between the conductive contact and the S/D structure or between the conductive contact and the gate stack are tunable according to requirements.

In accordance with some embodiments, a semiconductor device structure is provided. The semiconductor device structure includes a fin structure over a semiconductor substrate. The semiconductor device structure also includes an isolation feature over the semiconductor substrate. The fin structure is surrounded by the isolation feature. The semiconductor device structure further includes a gate stack covering the fin structure. In addition, the semiconductor device structure includes a S/D structure covering the fin structure. The semiconductor device structure also includes a conductive contact connected to the S/D structure. The conductive contact includes a first portion and a second portion. The second portion extends from the first portion to the S/D structure. The first portion has a first width adjoining the second portion. The second portion has a second width greater than the first width.

In accordance with some embodiments, a semiconductor device structure is provided. The semiconductor device structure includes a gate stack in a dielectric layer. The semiconductor device structure also includes a first conductive contact connected to the gate stack. The semiconductor device structure further includes S/D structures in the dielectric layer. The S/D structures are on opposite sides of the gate stack. In addition, the semiconductor device structure includes second conductive contacts connected to the S/D structures. The second conductive contacts include an enlarged portion adjoining one of the S/D structures, and the enlarged portion extends towards the gate stack.

In accordance with some embodiments, a method for forming a semiconductor device structure is provided. The method includes forming a gate stack covering a fin structure. The method also includes forming a S/D structure covering the fin structure. The method further includes forming a capping layer covering the S/D structure. In addition, the method includes forming a dielectric layer over the capping layer. The dielectric layer surrounds the S/D structure and the gate stack. The method also includes etching the dielectric layer and the capping layer to form a trench partially exposing the S/D structure. The method further includes etching the capping layer to form an opening partially exposing the S/D structure after the formation of the trench. Furthermore, the method includes filling the trench and the opening with a conductive material layer to form a conductive contact connected to the S/D structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a first fin structure over a semiconductor substrate;
   an isolation feature over the semiconductor substrate, wherein the first fin structure is surrounded by the isolation feature;
   a gate stack covering the first fin structure;
   a first source or drain (S/D) structure covering the first fin structure;
   a conductive contact connected to the first S/D structure, wherein the conductive contact comprises a first portion and a second portion, and the second portion extends from the first portion to the first S/D structure, and wherein the first portion has a first width adjoining the second portion, and the second portion has a second width greater than the first width;
   a first capping layer covering the first S/D structure; and
   a second capping layer covering the first capping layer, wherein the second portion of the conductive contact penetrates through the first capping layer and the second capping layer.

2. The semiconductor device structure as claimed in claim 1, wherein the first portion of the conductive contact gradually shrinks along a direction from the first fin structure towards the semiconductor substrate.

3. The semiconductor device structure as claimed in claim 1, wherein the second portion of the conductive contact protrudes from the first portion towards the gate stack and the isolation feature.

4. The semiconductor device structure as claimed in claim 1, further comprising:
   a first dielectric layer surrounding the first S/D structure and the gate stack; and
   a second dielectric layer covering the first dielectric layer and the gate stack, wherein the first portion of the conductive contact penetrates through the first dielectric layer and the second dielectric layer.

5. The semiconductor device structure as claimed in claim 1, further comprising:
   a second fin structure over the semiconductor substrate, wherein the second fin structure is surrounded by the isolation feature; and
   a second S/D structure covering the second fin structure, wherein the conductive contact is connected to the first S/D structure and the second S/D structure.

6. The semiconductor device structure as claimed in claim 5, wherein the conductive contact adjoins the isolation feature, the first S/D structure, and the second S/D structure.

7. A semiconductor device structure, comprising:
   a gate stack in a dielectric layer;
   a first conductive contact connected to the gate stack, wherein the first conductive contact comprises an enlarged portion adjoining the gate stack;
   first source or drain (S/D) structures in the dielectric layer, wherein the first S/D structures are on opposite sides of the gate stack, and the enlarged portion of the first conductive contact extends towards the first S/D structures; and
   second conductive contacts connected to the first S/D structures, wherein the second conductive contacts comprise an enlarged portion adjoining one of the first S/D structures, and the enlarged portion extends towards the gate stack.

8. The semiconductor device structure as claimed in claim 7, wherein the one of the first S/D structures is surrounded by the enlarged portion of the second conductive contacts.

9. The semiconductor device structure as claimed in claim 7, further comprising:
   second S/D structures in the dielectric layer, wherein the enlarged portion of the second conductive contacts surrounds the one of the first S/D structures and the second S/D structures.

10. The semiconductor device structure as claimed in claim 7, further comprising:
    a capping layer in the dielectric layer, wherein the enlarged portion of the second conductive contacts penetrates through the capping layer.

11. A semiconductor device structure, comprising:
    a gate stack in a dielectric layer;
    a first conductive contact connected to the gate stack, wherein the first conductive contact gradually shrinks along a direction from the first conductive contact towards the gate stack;
    a first source or drain (S/D) structure in the dielectric layer; and
    a second conductive contact connected to the first S/D structure, wherein an upper portion of the second conductive contact gradually shrinks along the direction, and an enlarged bottom portion of the second conductive contact protrudes from the upper portion towards the gate stack.

12. The semiconductor device structure as claimed in claim 11, further comprising:
    second S/D structures in the dielectric layer, wherein the enlarged bottom portion of the second conductive contact surrounds the first S/D structure and the second S/D structures.

13. The semiconductor device structure as claimed in claim 11, wherein the upper portion of the second conductive contact has a top width and a bottom width that is less than the top width, and wherein the enlarged bottom portion of the second conductive contact is wider than the top width and the bottom width.

14. The semiconductor device structure as claimed in claim 11, wherein the enlarged bottom portion of the second conductive contact is thinner than the upper portion of the second conductive contact.

15. The semiconductor device structure as claimed in claim 11, further comprising:
    a capping layer covering the first S/D structure; and
    an etch stop layer between the capping layer and the dielectric layer, wherein a thickness of the enlarged bottom portion of the second conductive contact is substantially equal to a sum of thicknesses of the capping layer and the etch stop layer.

16. The semiconductor device structure as claimed in claim 11, wherein a thickness of the enlarged bottom portion of the second conductive contact is substantially equal to a distance between the first S/D structure and the dielectric layer.

17. The semiconductor device structure as claimed in claim 11, wherein a contact area between the second conductive contact and the first S/D structure is greater than a contact area between the first conductive contact and the gate stack.

18. The semiconductor device structure as claimed in claim 11, wherein the first S/D structure and the dielectric layer partially sandwich the enlarged bottom portion of the second conductive contact.

19. The semiconductor device structure as claimed in claim 4, wherein a portion of the conductive contact is sandwiched between the first dielectric layer and the first S/D structure.

20. The semiconductor device structure as claimed in claim 4, wherein a distance between the first S/D structure and the first dielectric layer is substantially equal to the sum of thicknesses of the first capping layer and the second capping layer.

* * * * *